US008479075B2

(12) United States Patent
Zheng et al.

(10) Patent No.: US 8,479,075 B2
(45) Date of Patent: Jul. 2, 2013

(54) SYSTEM AND METHOD FOR PRESERVING NEIGHBORHOODS IN CODES

(75) Inventors: Lizhong Zheng, Lexington, MA (US); Yufei Blankenship, Kildeer, IL (US)

(73) Assignee: FutureWei Technologies, Inc., Plano, TX (US)

( * ) Notice: Subject to any disclaimer, the term of this patent is extended or adjusted under 35 U.S.C. 154(b) by 313 days.

(21) Appl. No.: 12/875,895

(22) Filed: Sep. 3, 2010

(65) Prior Publication Data

US 2012/0056764 A1 Mar. 8, 2012

(51) Int. Cl.
*H03M 13/00* (2006.01)

(52) U.S. Cl.
USPC ........... 714/752; 714/758; 714/704; 375/260; 375/341

(58) Field of Classification Search
USPC .................. 714/704, 752, 758; 375/260, 341
See application file for complete search history.

(56) References Cited

U.S. PATENT DOCUMENTS

| 7,168,033 | B1 * | 1/2007 | Wu et al. | 714/801 |
|---|---|---|---|---|
| 7,801,254 | B1 * | 9/2010 | Burd et al. | 375/341 |
| 2007/0253496 | A1 * | 11/2007 | Giannakis et al. | 375/260 |
| 2011/0087933 | A1 * | 4/2011 | Varnica et al. | 714/704 |

FOREIGN PATENT DOCUMENTS

| CN | 101150379 A | 3/2008 |
|---|---|---|
| CN | 101286822 A | 10/2008 |
| CN | 101394254 A | 3/2009 |
| CN | 101459488 A | 6/2009 |

OTHER PUBLICATIONS

Zeger, K., et al., "Pseudo-Gray Coding," IEEE Transactions on Communications, vol. 38, No. 12, Dec. 1990, pp. 2147-2158.
Patent Cooperation Treaty (PCT) International Search Report for PCT/CN2011/075677, mailed Sep. 29, 2011, 4 pages.

* cited by examiner

*Primary Examiner* — Sam Rizk
(74) *Attorney, Agent, or Firm* — Slater & Matsil, L.L.P.

(57) ABSTRACT

A system and method for preserving neighborhoods in codes are provided. A method for transmitting information includes receiving an information string to transmit, generating a first address and a second address from the information string, encoding the first address and the second address with a layered code encoder, thereby producing a codeword and transmitting the codeword. The generating is based on a linear block code.

26 Claims, 6 Drawing Sheets

SYSTEM AND METHOD FOR PRESERVING NEIGHBORHOODS IN CODES

TECHNICAL FIELD

The present invention relates generally to digital communications, and more particularly to a system and method for preserving neighborhoods in codes.

BACKGROUND

In general, a neighborhood preserving code may be described as a code having a property that if two information strings are similar to each other, i.e., if a Hamming distance between the two information strings are small, then resulting codewords arising from the encoding of the two information strings with the code would also be close to each other. The neighborhood preserving property may be analogous to requiring that a coding map for the code be continuous, so that a neighborhood of an input information string is preserved after mapping.

Neighborhood preserving codes may be useful for several reasons. They include:
  If a neighborhood preserving code is considered to be a normal channel code, except that an input string-to-codeword association is arranged in such a way that close-by information strings are mapped to close-by codewords. With such a code, even if a decoding of a received codeword makes an error, i.e., a codeword error, since the erroneous codeword is most likely to be a codeword that is close to a transmitted codeword corresponding to the received codeword, the decoded information bits are still close to information transmitted in the transmitted codeword. Therefore, a resulting bit error rate is minimized.
  Neighborhood preserving codes may also be used for joint source channel codes. An input to a neighborhood preserving code may be considered to be a source description. Transmitted over a noisy channel, it may be inevitable that in some cases, the transmitted codeword is not received correctly. However, with the use of the neighborhood preserving code, a bit string decoded from the received codeword is still close to the transmitted bit string. Therefore, a graceful degradation of the reconstruction of the transmitted bit string is afforded.
  Neighborhood preserving codes may also be used in multi-terminal scenarios. A relay node in a communications system may observe a noisy version of a transmitted signal. The relay node may need to decide if it can decode the transmitted signal correctly. Typically, the relay node's only option may be to amplify and forward the transmitted signal, which may limit overall performance. With a neighborhood preserving code, the relay node may be able to decode the transmitted signal with a confidence that most of the decoded bits are indeed correct. The relay node may then forward the decoded version of the transmitted signal with a high degree of confidence.

SUMMARY OF THE INVENTION

These and other problems are generally solved or circumvented, and technical advantages are generally achieved, by preferred embodiments of the present invention which provide a system and method for preserving neighborhoods in codes.

In accordance with a preferred embodiment of the present invention, a method for transmitting information is provided. The method includes receiving an information string to transmit, generating a first address and a second address from the information string, encoding the first address and the second address with a layered code encoder, thereby producing a codeword and transmitting the codeword. The generating uses a linear operation.

In accordance with another preferred embodiment of the present invention, a method for receiver operation is provided. The method including receiving an information vector from a transmission made by a transmitter, decoding a first address and a second address from the information vector, and generating an information string from the first address and the second address. The decoding is performed by a layered code decoder, and the generating uses a linear operation.

In accordance with another preferred embodiment of the present invention, a transmitter is provided. The transmitter includes a channel encoder and a modulator/transmitter circuit coupled to the channel encoder. The channel encoder generates an output codeword from an information vector provided by an information input, the information vector is encoded by a layered neighborhood preserving code. The modulator/transmitter circuit prepares the output codeword for transmission over a physical channel.

In accordance with another preferred embodiment of the present invention, a communication module is provided. The communications module includes an address generator, a layered code encoder coupled to the address generator, and a transmitter. The address generator generates a first address and a second address from an information string using a linear operation, the layered code encoder encodes the first address and the second address thereby producing a codeword, and the transmitter transmits the codeword.

An advantage of an embodiment is that a simple technique for generating codewords encoded by layered neighborhood preserving codes and decoding of codewords encoded by layered neighborhood preserving codes are provided. A simple encoding and decoding with linear codes preserves the neighborhood to a desired extent.

A further advantage of an embodiment is that a degree that the neighborhood is preserved may be specified, thereby allowing for a trade-off in code complexity, computational requirements, and error protection performance.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a communications system, such as a wireless communications system, that encodes information to be transmitted using a neighborhood preserving code. In particular, the neighborhood preserving code is implemented with a layered code, thus the code is also called a layered neighborhood preserving code.

Figure 1:
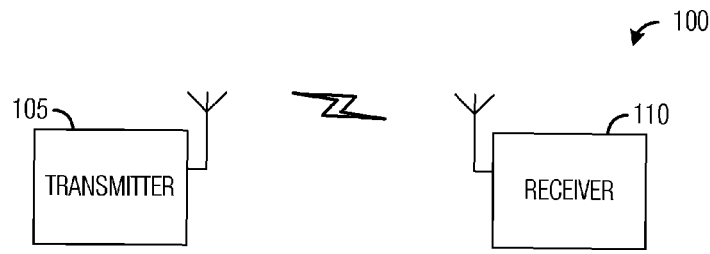
FIG. 1 is a diagram of a communications system.

FIG. 1 illustrates a communications system 100. Communications system 100 includes a transmitter 105 and a receiver 110. Transmitter 105 and receiver 110 may be individual electronic devices or they may be part of electronic devices. For example, transmitter 105 may be coupled to an information source and may be used solely to transmit information provided by the information source. Similarly, receiver 110 may be coupled to an information sink and may be used solely to receive information transmitted by transmitter 105 and/or other transmitters in communications system 100. Alternatively, transmitter 105 (receiver 110) may be part of an electronic device that also includes a receiver (a transmitter), and therefore may be capable of two-way communications.

In general, information transmitted by transmitter 105 may be encoded with a code prior to transmission. Encoding the information with the code may help to increase a likelihood that the information may be correctly received by receiver 110. For example, the code may provide a degree of error detection and correction to the information, and errors incurred due to a noisy channel between transmitter 105 and receiver 110 may possibly be detected and corrected. An example of a code that may be used to encode the information for transmission may be one of a class of codes referred to as neighborhood preserving codes.

Figure 2A:
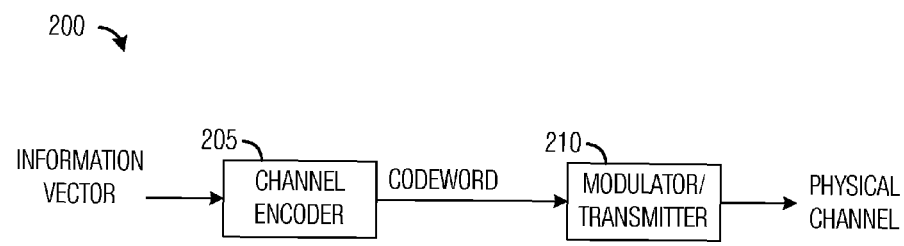
FIG. 2a is a diagram of a transmit portion of a communications device, wherein circuitry in a transmit chain are shown.

FIG. 2a illustrates a transmit portion of a communications device 200, wherein circuitry in a transmit chain are shown. Circuitry in the transmit chain of communications device 200 may include a channel encoder 205 that may be used to convert information to be transmitted (in the form of an information vector, for example) into one or more codewords. Channel encoder 205 may generate the one or more codewords using linear code decoders, syndrome calculators of linear codes, layered code encoders, and so forth, wherein the one or more codewords may correspond to codewords of a code from a class of neighborhood preserving codes. A detailed discussion of a channel encoder that encodes information using a neighborhood preserving code is provided below.

The one or more codewords outputted by channel encoder 205 may then be provided to a modulator/transmitter 210. Modulator/transmitter 210 may be used to provide processing for the one or more codewords in order to prepare the one or more codewords for transmission. Modulator/transmitter 210 may perform processing such as modulating, interleaving, amplifying, filtering, digital to analog conversion, and so forth. Output from modulator/transmitter 210 may be injected onto a physical channel. The physical channel may be a wireless communications channel or a wireline physical channel.

Figure 2B:
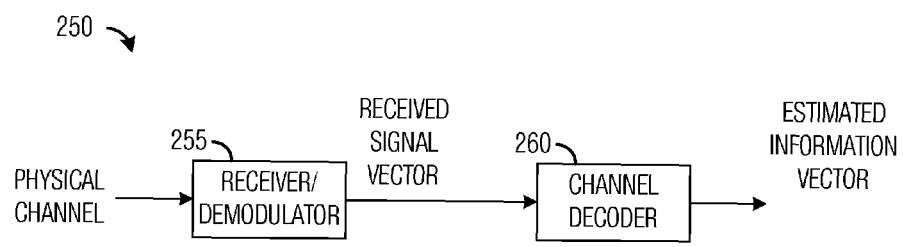
FIG. 2b is a diagram of a receive portion of a communications device, wherein circuitry in a receive chain are highlighted.

FIG. 2b illustrates a receive portion of a communications device 250, wherein circuitry in a receive chain are highlighted. Circuitry in the receive chain of communications device 250 may include a receiver/demodulator 255 that may be used to convert a signal received over a communications channel into a received signal vector, wherein the communications channel may be a wireless or wireline communications channel. Receiver/demodulator 255 may provide processing to the received signal, including demodulating, de-interleaving, amplifying, filtering, analog to digital conversion, and so forth. Output of receiver/demodulator 255 may be provided to a channel decoder 260 that may be used to convert the received signal vector into an estimated information vector, which may be a representation of an information vector (e.g., one or more codewords) transmitted to communications device 250 that may be altered by the communications channel.

Channel decoder 260 may convert the received signal vector (comprising received codeword(s)) back to an estimated information vector using layered code decoders, linear code encoders, linear code coset leader finders, and so on, wherein the received codeword(s) may correspond to codewords of a code from a class of neighborhood preserving codes. A detailed discussion of a channel decoder that decodes information encoded using a neighborhood preserving code is provided below.

In general, an ideal neighborhood preserving code is very similar to continuous maps, wherein both an input space and an output space must have identical topology. On the other hand, it is also clear that a problem is to find a mapping between spaces with different dimensions. Therefore, a continuous map or an ideal neighborhood preserving code may not be found. Hence, a non-ideal neighborhood preserving code that preserves the neighborhood to a specified extent, herein referred to as a layered neighborhood preserving code, is desired. The use of a layered neighborhood preserving code may still allow for achieving of the goal of minimizing bit error rate for a given codeword error probability, but in a slightly relaxed way.

Consider the following design for a layered neighborhood preserving code:

First, an ideal neighborhood preserving code or continuous map preserves neighborhoods of any size. That is, $$\forall x_0 \in \aleph, \epsilon > 0 : d(x, x_0) < \epsilon \Leftrightarrow d(f(x), f(x_0)) < \delta \quad (1)$$

for some $\delta$ as a function of $\epsilon$, and goes to 0 as $\epsilon$ tends to 0. In other words, any small neighborhood of $x_0$ is mapped to a small neighborhood of $f(x_0)$. Since such neighborhood preservation is impossible, the aim is to design a code that only protect to a finite level of neighborhoods. That is, ensure Relation (1) is met for a finite collection of $\epsilon_1, \epsilon_2, \ldots, \epsilon_k$, and their corresponding $\delta_1, \delta_1, \ldots, \delta_k$. As discussed herein, a focus may be on a special case when k=1, i.e., there is a particular size of the neighborhood that is to be preserved. It will be clear from the construction that the results may be extended to multiple layers and hence design neighborhood preserving codes with k>1.

Second, Relation (1) requires that an entire neighborhood be preserved. That is, $\forall x_0$ with $d(x, x_0) < \epsilon$, it is required that the image of x is close to that of $x_0$. The focus herein is to only preserve a majority of the neighborhood. That is, a requirement is that only most of the strings in a $\epsilon$ neighborhood of $x_0$ be mapped to a $\delta$ neighborhood of $f(x_0)$.

Third, Relation (1) requires the neighborhood at any point of the input space to be preserved. It may be possible to further relax the requirements by only requiring the neighborhood be preserved for a majority of points in the input space. With the relaxation of the requirements, the property is still maintained so that if the input is uniformly distributed over all bit strings, then with a high probability, Relation (1) holds.

In the discussion of layered neighborhood preserving code, the neighborhood preserving property may be relaxed in one or more of the ways described above. Relaxation of the neighborhood preserving property allows the application of linear block codes and layered codes in the code construction, which leads to simple and efficient implementation in both the encoder and the decoder.

A limit of a neighborhood preserving code may be expressed as:

Proposition 1: Consider a rate R code of length n. That is, an information vector of nR information bits, R<1, may be encoded into a codeword of length n. Suppose that there is a desire to preserve a neighborhood of radius nR$\epsilon$. That is, every two information strings with distance less than nR$\epsilon$ are mapped to codewords with distance no more than n$\delta$. A bound on parameter $\delta$ is expressible as $$\delta \leq H_b^{-1}(RH_b(\epsilon) + H_b(d)). \quad (2)$$

The bound may be derived as follows. Suppose that the minimum distance between codewords is 2·nd, i.e., each codeword has a decision region of radius nd. A sphere packing bound may be as follows.

There are $2^{nRH_b(\epsilon)}$ neighboring strings in the neighborhood, where $$H_b(p) = -p \log p - (1-p) \log(1-p)$$

is a binary entropy function. Each of these strings has a non-overlapping decision region of radius nd. Packing these decision regions in a sphere, the resulting volume of the union is expressible as $$2^{nRH_b(\epsilon)} \cdot 2^{nH_b(d)} < 2^{nH_b(\delta)} \quad (3)$$

which give rise to the bound of Equation (2).

The analysis above shows that there is a tradeoff between how large $\delta$ is and a level of the error protection may be obtained. Proposition 1 may be used to design a neighborhood preserving code that preserves neighborhoods to a specified distance. For example, a distance in an output space that is larger than n$\delta$ may be viewed as a "large" distance, or loss of neighborhood information, and any two points that are within a distance of n$\delta$ may be viewed to be in a single neighborhood. The sphere packing statement (Equation (3)) above gives rise to a bound approximation of how large a neighborhood should be in terms of the error protection ability provided by codeword distance nd and a size of neighborhood nR$\epsilon$ in the input space.

According to an embodiment, layered codes, which are discussed in detail in co-assigned U.S. patent application Ser. No. 12/693,345, filed Jan. 25, 2010, entitled "System and Method for Digital Communications with Unbalanced Codebooks," which patent application is incorporated herein by reference, may be used to generate neighborhood preserving codes that preserve neighborhoods to a specified distance.

Figure 3:
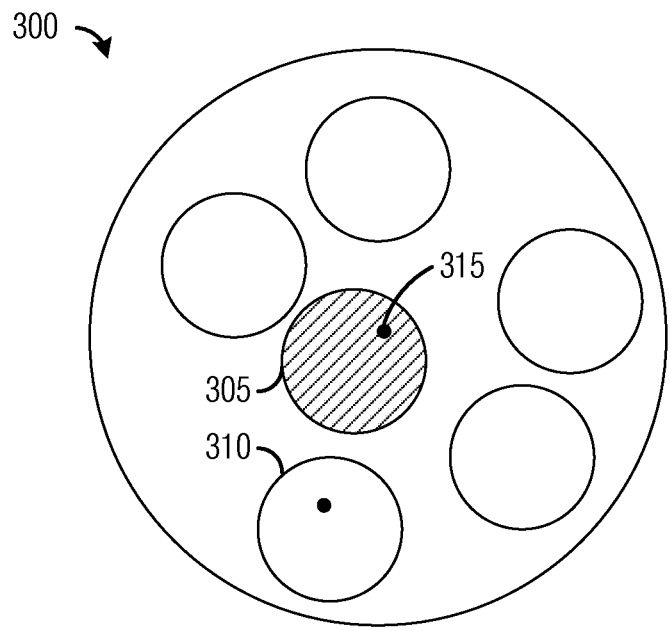
FIG. 3 is a diagram of a code space and a plurality of neighborhoods in the code space.

FIG. 3 illustrates a code space 300 and a plurality of neighborhoods in code space 300. Consider mapping an information vector composed of two different groups of information bits to n-bit codewords: $k_1$ more important bits (e.g., most significant bits (MSB)) and $k_2$ less important bits (e.g., least significant bits (LSB)), where $k_1 + k_2 = k$. Rather than being concerned about the neighborhood of the aggregate vector of both groups of bits, it may be easier to design a code with a cloud-like structure, where the code has an input of $(k_1 + k_2)$ bits, and the $k_1$ bits (the MSB) decides which cloud (e.g., a neighborhood such as neighborhoods 305 and 310) a corresponding codeword stays, and the $k_2$ bits (the LSB) decides where within the cloud (neighborhood) the codeword (e.g., codeword 315) is located. In other words, the LSB may be an index to a codeword. As shown in FIG. 3, a cloud of codewords may be a group of codewords that are close to each other in an output space, such as in code space 300.

If the clouds (neighborhoods) are isolated from one another, then the MSB (the $k_1$ bits) may correspond to an index or address of the cloud (neighborhood) and the LSB (the $k_2$ bits) may provide a detailed address within a neighborhood indexed by the MSB. With such a code, and with encoding and decoding techniques discussed below, a computable map that indexes the space by its inter- and intra-neighborhood addresses is obtained. A code with such structure may be realized by a layered neighborhood preserving code where a layered code is used as a component code to achieve the neighborhood preserving property.

According to an embodiment, in a layered neighborhood preserving code, differences in bits of the MSB may correspond to codewords in different clouds (neighborhoods) and therefore, leading to a much larger distance between codewords. However, differences in bits of the LSB may only put codewords at different places within a single cloud. In other words, the neighborhood information is very insensitive to the LSB. Therefore, neighborhood information may not actually be directly preserved, but is handled as follows: 1) any difference in the MSB may lead to completely different neighborhoods and hence may cause a large distance between output codewords; and 2) any difference in the LSB may not affect the neighborhood at all.

One technique that may be used to take advantage of layered neighborhood preserving codes is to make a distance between neighborhood centers be at least four times a radius of a neighborhood, D. By making the neighborhoods four radii apart, it is ensured that any two codewords with radius less than or equal to 2D apart will stay in the same neighborhood and therefore share the same MSB. The only difference between the two codewords would be in the LSB.

Making the distance between neighborhood centers larger than 4D may make the technique more aggressive, so that a probability that a codeword received over a noisy channel may be mistaken for a codeword in a different neighborhood is made even smaller.

Additionally, it may be possible to make the distance between neighborhood centers smaller than 4D may make the technique less aggressive, and may compromise how well Relation (1) is being achieved in a probabilistic way. However, decreasing the distance between neighborhood centers may allow for higher rates.

Figure 4:
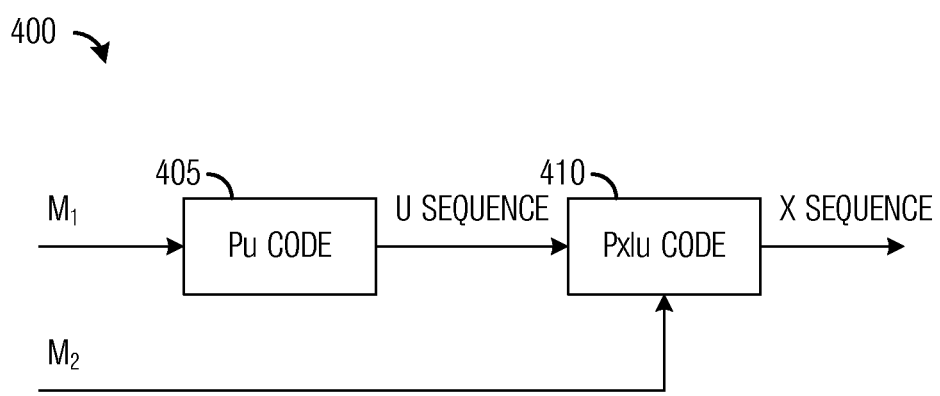
FIG. 4 is a diagram of a layered code encoder.

FIG. 4 illustrates a layered code encoder 400. The design of layered neighborhood preserving codes may be achieved using layered codes. Layered code encoder 400 includes two input streams of data, $M_1$ (corresponding to the MSB) and $M_2$ (corresponding to the LSB).

A first encoder 405 may be used to encode the $M_1$ input stream into a U sequence, which has distribution Pu. A second encoder 410 may be used to encode the $M_2$ input stream into an X sequence based on the U sequence, which has distribution Px|u according to the corresponding value of u, from the first code.

In general, operation of layered code encoder 400 may be described as a multi-phase encoder, wherein in a first phase, layered code encoder 400 may generate an intermediate information string from a first of its multiple input streams of data, e.g., $M_1$, and then in a second phase, layered code encoder 400 may generate an output codeword based on the intermediate information string and a second of its multiple input streams of data, e.g., $M_2$.

A simplifying assumption in the design of layered neighborhood preserving codes is that while any distance between neighborhoods, as well as any individual neighborhood size may be chosen, a practical constraint may require that a conveniently implementable code at a certain rate is selected.

Conceptually, in order to design layered neighborhood preserving codes using layered codes, all points on an input space, i.e., all possible data strings of dimension k=nR, may need to be converted to inputs of the layered codes. That is, k information bits are transformed with an invertible map into two groups of bits of length $k_1$ (sequence $M_1$) and $k_2$ (sequence $M_2$), respectively. The length-$k_1$ bit vector $M_1$ corresponds to a neighborhood identifier (neighborhood ID), and length-$k_2$ bit vector $M_2$ corresponds to an intra-neighborhood address. Then the two groups of bits are provided to a neighborhood encoder, which puts different neighborhood at different places on an output space, with appropriate distances between neighborhoods, and with desired distances between codewords within each neighborhood.

Figure 5:
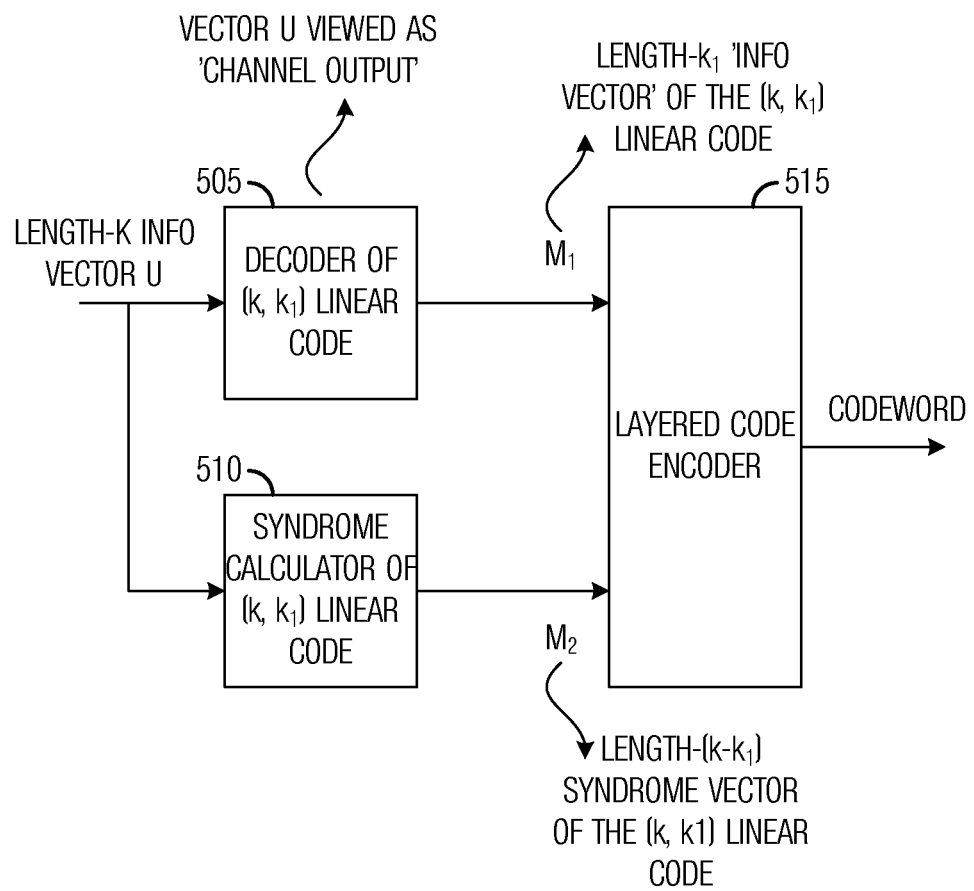
FIG. 5 is a diagram of a layered neighborhood preserving encoder.

FIG. 5 illustrates a layered neighborhood preserving encoder 500. Layered neighborhood preserving encoder 500 may be used to encode an input vector U of length k into a codeword, wherein the encoding makes use of a layered neighborhood preserving code.

In order to encode the input vector U with the layered neighborhood preserving code, layered neighborhood preserving code encoder 500 may first obtain a $k_1+k_2$ neighborhood format representation of the input vector U. As an example, the input vector U may be quantized into Voronoi regions. Each of the Voronoi regions may be treated as a neighborhood. Voronoi regions are considered to be well known by those of ordinary skill in the art of the present invention and will not be discussed further herein.

However, the input vector U (k bits in length) is typically large, corresponding to a requirement of encoding long bit strings. Therefore, it may be important to find an efficient algorithm for encoding long bit strings.

According to an embodiment, on technique that may be used to encode long bit strings is to make use of existing linear block codes and encoding and decoding processes that are already available for encoding and decoding linear block codes, i.e., make use of linear operations. Since linear block codes have been used for a long time, many efficient encoding and decoding processes are available for encoding and decoding linear block codes. In order to use linear block codes, the input vector U may be considered to be an outcome of a noisy channel and provided to a decoder of a (k, $k_1$) linear code, where k=$k_1+k_2$.

Let a generator matrix of the (k, $k_1$) linear code be G, where G is of size $k_1 \times k$. Furthermore, let H be the corresponding parity check matrix of the (k, $k_1$) linear code and is a $k_2 \times k$ matrix, where $k_2$=k−$k_1$. The (k, $k_1$) linear code may be referred to as a neighborhood extraction code.

A decoder 505, which may be a decoder of the (k, $k_1$) linear code, may be used to decode the input vector U (k bits in length), U∈$F_2^k$, taking the input vector U as if it is a channel output of the (k, $k_1$) linear code (possibly contaminated with channel noise). The input vector U may be represented as a vector of size 1×k. Decoder 505 may produce a size 1×$k_1$ vector $M_1$ as an index of the neighborhood ID. Decoder 505 may find the vector $M_1$ that satisfies $$U = M_1 G + E, \qquad (4)$$

where E is an 1×k vector which is an error vector that decoder 505 has overcome. In classical linear decoding, E may be referred to as a coset leader of the linear code defined by G.

A syndrome calculator 510, which may be a syndrome calculator of the (k, $k_1$) linear code, may be used to calculate a syndrome ($M_2 = UH^T$) of the input vector U, where $M_2$ is a 1×$k_2$ vector that provides the address within the neighborhood. Note that $$M_2 = UH^T = (M_1 G + E) H^T = EH^T. \qquad (5)$$

A layered code encoder 515 may combine vector $M_1$ and vector $M_2$ to produce a codeword corresponding to the input vector U. Layered code encoder 515 may be an implementation of layered code encoder 400. Due to the operation of the neighborhood extraction code, the data stream of $M_1$ defines the neighborhood and the data stream of $M_2$ defines a location within the neighborhood. Thus data stream of $M_1$ carries more important information than data stream $M_2$. Accordingly, the layered code encoder 400 treats $M_1$ as the more important layer, and $M_2$ as the less important layer. More protection is granted to $M_1$, with $M_2$ superposed onto $M_1$, for example.

Decoder 505, syndrome calculator 510, and layered code encoder 515 may be implemented as procedures, functions, or software to be executed in a processor or processing element, digital signal processor, custom designed integrated circuit, or so on. Alternatively, decoder 505, syndrome calculator 510, and layered code encoder 515 may be implemented in firmware or hardware, such as a field programmable logic array, application specific integrated circuit, or so forth.

Figure 6:
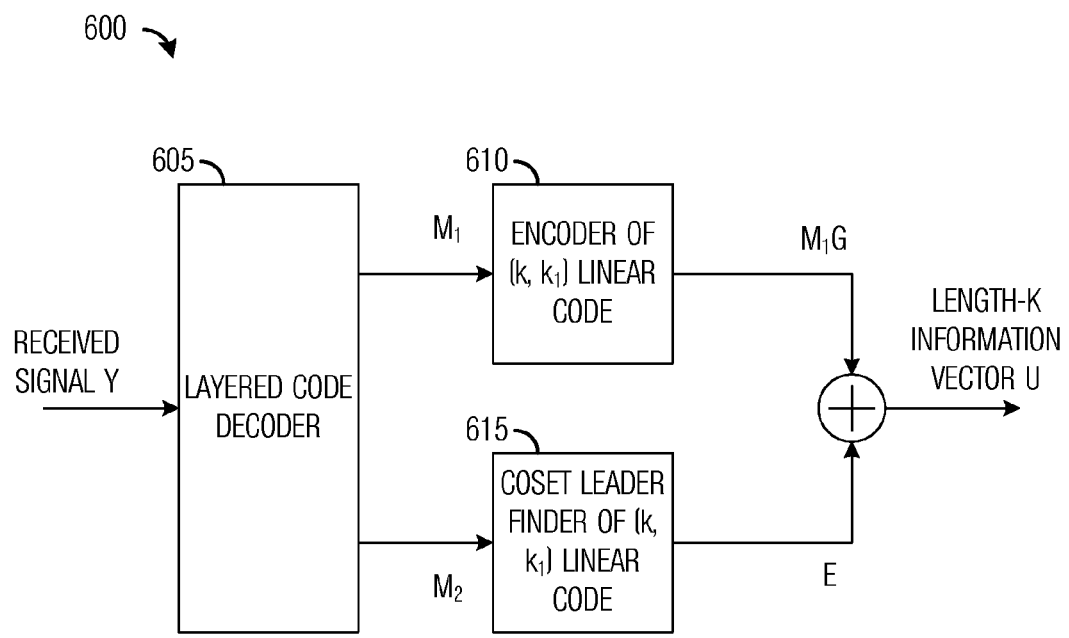
FIG. 6 is a diagram of a layered neighborhood preserving code decoder.

FIG. 6 illustrates a layered neighborhood preserving code decoder 600. Layered neighborhood preserving code decoder 600 may implement an inverse operation of layered neighborhood preserving code encoder 500. Once again, encoding and decoding processes for linear block codes may be used to provide efficient techniques for encoding and decoding long bit strings.

A layered code decoder 605 may be provided a vector Y received from a channel. Vector Y may be representative of a received codeword(s) from a transmitter. Layered code decoder 605 may output estimates of vector $M_1$ and vector $M_2$ from vector Y. Vector $M_1$ may be provided to an encoder 610, which may be an encoder of the (k, $k_1$) linear code. Encoder 610 may be used to encode the vector $M_1$ into a 1×k vector $M_1 G$.

Vector $M_2$ may be provided to a coset leader finder 615, which may be a coset leader finder of the same (k, $k_1$) linear code. Coset leader finder 615 may find a coset leader E that corresponds to vector $M_2$ (syndrome $M_2$).

Layered neighborhood preserving code decoder 600 may then combine the 1×k vector $M_1G$ and the coset leader E into an estimate of the vector U, with the combining of the 1×k vector $M_1G$ and the coset leader E performed by adding the two vectors bit-by-bit, for example. Recall that the relationship $U=M_1G+E$ is utilized in the encoder.

Layered code decoder 605, encoder 610, and coset leader finder 615 may be implemented as procedures, functions, or software to be executed in a processor or processing element, digital signal processor, custom designed integrated circuit, or so on. Alternatively, layered code decoder 605, encoder 610, and coset leader finder 615 may be implemented in firmware or hardware, such as a field programmable logic array, application specific integrated circuit, or so forth.

Figure 7:
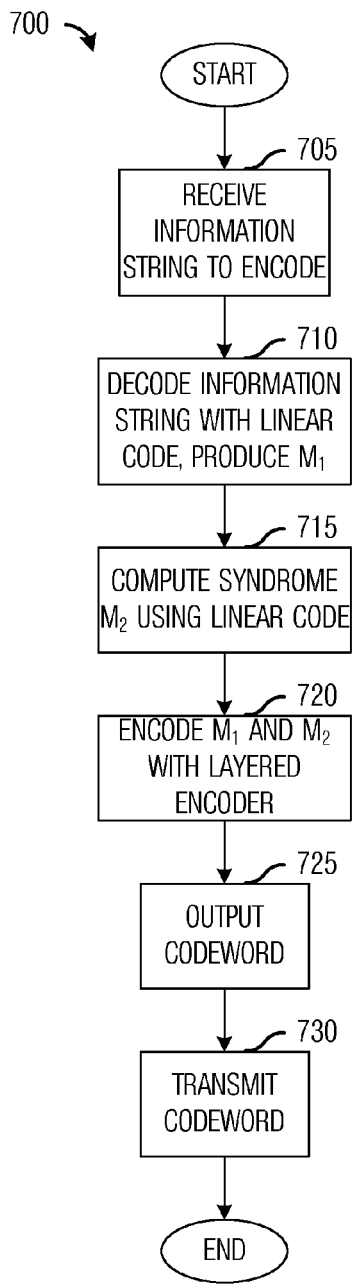
FIG. 7 is a flow diagram of transmitter operations in transmitting information to a receiver.

FIG. 7 illustrates a flow diagram of transmitter operations 700 in transmitting information to a receiver. Transmitter operations 700 may be indicative of operations occurring in a transmitter, such as transmitter 105, as the transmitter encodes information to be transmitted and then transmits the encoded information (in the form of codewords, for example) to a receiver, such as receiver 110. Preferably, the transmitter may encode the information to be transmitted using a layered neighborhood preserving code. Transmitter operations 700 may occur while the transmitter is in a normal operating mode and while the transmitter has information to transmit to the receiver.

Transmitter operations 700 may begin with the transmitter receiving a k-bit information string to encode (block 705). According to an embodiment, since k may typically be a large value, encoding the k-bit information string should be performed using as efficient an encoding process as possible. For example, linear block codes are widely known and there are many efficient encoding processes for linear block codes.

The k-bit information string may be decoded to produce a vector $M_1$ of length $k_1$ (block 710), $k_1<k$. Preferably, the decoding of the k-bit information may be performed with a linear block code decoder for a $(k, k_1)$ linear code. In general, the vector $M_1$ may satisfy $U=M_1G+E$, where U is the k-bit information string, G is a generator matrix of the $(k, k_1)$ linear code, and E is an error vector.

The k-bit information string may also be used to compute a syndrome $M_2$ of length $k_2$ (block 715), where $k_2=k-k_1$. Preferably, the computing of the syndrome $M_2$, where $M_2=UH^T$, may be performed with a syndrome calculator for the $(k, k_1)$ linear code.

The vector $M_1$ and the vector $M_2$ may then be provided to a layered code encoder to generate a codeword that corresponds to the vector $M_1$ and the vector $M_2$ (block 720). The codeword generated from the vector $M_1$ and the vector $M_2$ may be outputted (block 725) and then transmitted to the receiver (block 730). Transmitter operations 700 may then terminate.

Figure 8:
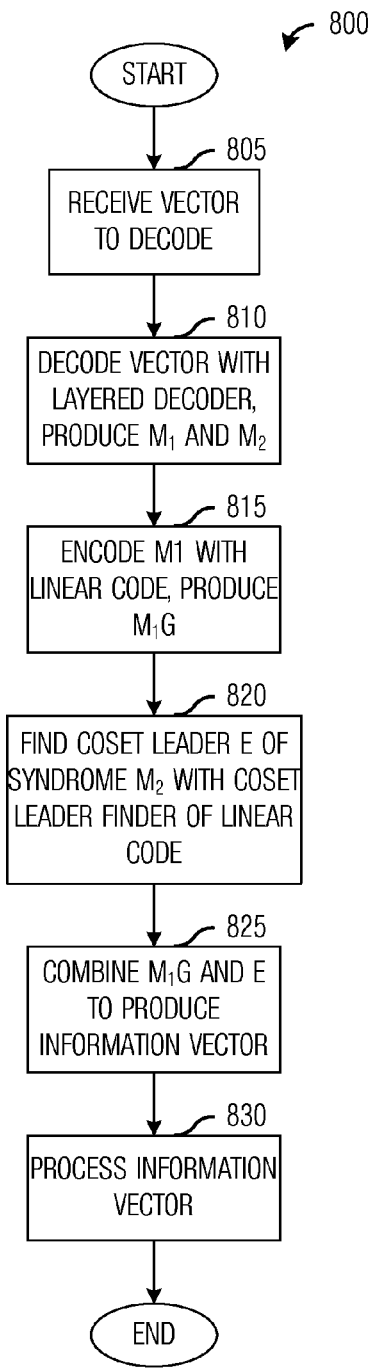
FIG. 8 is a flow diagram of receiver operations in receiving information from a transmitter.

FIG. 8 illustrates a flow diagram of receiver operations 800 in receiving information from a transmitter. Receiver operations 800 may be indicative of operations occurring in a receiver, such as receiver 110, as the receiver receives transmitted information (in the form of codewords, for example) from a transmitter, such as transmitter 105, and decodes the received information. Preferably, the received information may have been encoded using a layered neighborhood preserving code. Receiver operations 800 may occur while the receiver is in a normal operating mode and while the receiver is receiving information from the transmitter.

Receiver operations 800 may begin with the receiver receiving a vector from the channel to decode (block 805). The received vector may be a received version of a codeword transmitted by the transmitter. The received vector may be provided to a layered code decoder, which outputs estimates of vector $M_1$ and vector $M_2$ from the information vector (block 810). In principle, vector $M_1$ may be an index to a neighborhood ID and vector $M_2$ may be an address within a neighborhood. Vectors $M_1$ and $M_2$ may be realized with linear codes by making vector $M_1$ the information vector of a $(k, k_1)$ linear code, and vector $M_2$ the syndrome vector of the same $(k, k_1)$ linear code.

The vector $M_1$ may be encoded by an encoder of the $(k, k_1)$ linear code to produce a codeword $M_1G$, i.e., the vector $M_1$ multiplied by a generator matrix G (block 815). The vector $M_2$ may be used to find a coset leader of the $(k, k_1)$ linear code, E, corresponding to the vector $M_2$ (the syndrome) (block 820).

The output of the encoder ($M_1G$) and the output of the coset leader finder (E) may be combined to produce an estimate of the information vector (block 825) and the information vector may be processed by the receiver (block 830). According to an embodiment, the combination (or addition) of $M_1G$ and E may be performed in a bit-wise manner. Receiver operations 800 may then terminate.

In general, the performance achieved by the embodiments may be dependant on a strictness of the implementation of Relation (1) and how close the performance limit disclosed in Proposition 1 is achieved. For example, to reduce bit error rate, a typical approach may be to set the neighborhood center distances to be 2D with neighborhood radius to be D, i.e., the neighborhoods are almost overlapping each other. In the above described scenario, the transmission rate is maximized as well as the distance between codewords. The above described scenario may result in a comparable codeword error rate with other channel codes with the same rate.

However, there is an additional benefit for a large fraction of codewords, particularly, codewords that are in the interior of the neighborhoods, where the more likely decoding errors would still result in codewords within the same neighborhood. Due to the design of the neighborhoods, codewords within the same neighborhood have a guarantee of being no more than $2k_2$ Hamming distance away from each other (and therefore the transmitted information).

The worst case occurs with codewords that are on the boundary of a neighborhood, for which a direction of the decoding error matters. Only a fraction of the "inward" detection errors would land within the neighborhood, with limits of the bit errors. Therefore, an overall reduction of the bit error rate needs to be evaluated by averaging overall all different codewords.

A more interesting situation may arise when there is willingness to tradeoff symbol error rate by reducing the distance between codewords with in a neighborhood, and thus allowing space to keep the neighborhoods apart. For example, for neighborhood center distances ranging between [2D, 4D], it may be possible to smoothly tradeoff between a probability that a decoding error may result in a neighborhood change (changing from one neighborhood to another neighborhood) and a codeword change within the same neighborhood.

According to an embodiment, instead of two layers, it may be possible to use N layers, where N is greater than or equal to three. For example, when three layers (N=3) are used, there may be a tradeoff between three probabilities: the codeword error rate, the probability of making errors on more than $k_2$ bits, and the probability of making errors on more than $k_3$ bits, and so on. Therefore, the discussion of two layers should not be construed as being limiting to either the scope or the spirit of the embodiments.

Figure 9:
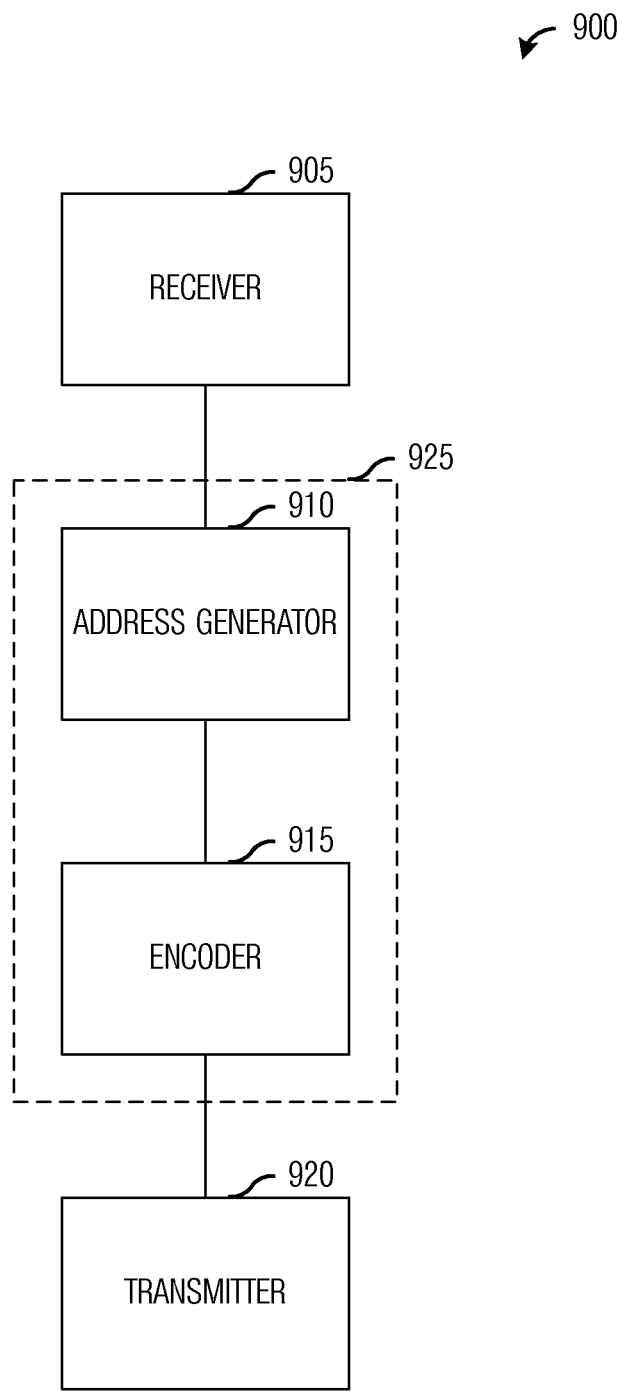
FIG. 9 is a diagram of a communications module.

FIG. 9 provides an alternate illustration of a communication module 900. Communication module 900 may be used to implement various ones of the embodiments discussed herein. As shown in FIG. 9, a receiver 905 is configured to receive an information string. An address generator 910 is configured to generate a first address and a second address from the information string using a linear operation. A layered code encoder 915 is configured to encode the first address and the second address thereby producing a codeword. A transmitter 920 configured to transmit the codeword.

The elements of communications module 900 may be implemented as specific hardware logic blocks. In an alternative, the elements of communications 900 may be implemented as software executing in a processor, controller, application specific integrated circuit, or so on. In yet another alternative, the elements of communications 900 may be implemented as a combination of software and/or hardware.

As an example, receiver 905 and transmitter 920 may be implemented as specific hardware blocks, while address generator 910 and encoder 915 may be software modules executing in a processor 925 or custom compiled logic arrays of a field programmable logic array.

Additionally, an element of communications module 900 may include sub-elements. As an example, encoder 915 may include an information string generator configured to generate an intermediate information string based on the first address and a codeword generator coupled to the information string generator configured to generate a codeword based on the intermediate information string and the second address. An illustrative example of encoder 915 is shown in FIG. 4.

Similarly, address generator 910 may include a decoder and a syndrome calculator. The decoder configured to generate the first address based on a linear block code and the syndrome calculator configured to generate the second address based on the linear block code.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for transmitting information, the method comprising:
   receiving an information string to transmit;
   generating a first address and a second address from the information string using a linear operation;
   encoding the first address and the second address using a layered code encoder to produce a codeword from both the first and second addresses; and
   transmitting the codeword.

2. The method of claim 1, wherein generating a first address and a second address comprises:
   generating the first address from the information string, wherein generating the first address is based on a linear block code; and
   generating the second address from the information string, wherein generating the second address is based on the linear block code.

3. The method of claim 2, wherein generating the first address comprises decoding the information string with a linear block code decoder.

4. The method of claim 3, wherein the first address satisfies $$U = M_1 G + E,$$

where U is the information string, $M_1$ is the first address, G is a generator matrix for the linear block code, and E is an error vector.

5. The method of claim 2, wherein generating the second address comprises computing a syndrome from the information string based on the linear block code.

6. The method of claim 5, wherein generating the second address comprises evaluating $$M_2 = U H^T,$$

where $M_2$ is the second address, U is the information string, and H is a parity check matrix of the linear block code.

7. The method of claim 1, wherein encoding the first address and the second address comprises:
   generating an intermediate information string based on the first address; and
   generating the codeword based on the intermediate information string and the second address.

8. The method of claim 1, wherein the linear operation is based on a linear block code, and wherein the information string is of length k, the first address is of length $k_1$, and the second address is of length $(k-k_1)$, where k and $k_1$ are integer values, and wherein the linear block code comprises a $(k, k_1)$ linear block code.

9. A method for receiver operation, the method comprising:
   receiving an information vector from a transmission by a transmitter;
   decoding a first address and a second address from the information vector using a layered code decoder; and
   generating an information string from both the first address and the second address using a linear operation.

10. The method of claim 9, wherein generating an information string comprises:
    generating a first vector from the first address based on a linear block code;
    generating a second vector from the second address based on the linear block code; and
    forming the information string by combining the first vector and second vector.

11. The method of claim 10, wherein generating the first vector comprises encoding the first address with a linear block code encoder.

12. The method of claim 11, wherein the first vector comprises $M_1 G$, where $M_1$ is the first address, and G is a generator matrix for the linear block code.

13. The method of claim 10, wherein generating the second vector comprises generating a coset leader corresponding to the second address.

14. The method of claim 13, wherein the second address comprises a syndrome.

15. The method of claim 10, wherein combining the first vector and the second vector comprises a bit-wise addition of the first vector and the second vector.

16. A transmitter comprising:
    a channel encoder configured to generate an output codeword from an information vector provided by an information input, wherein the information vector is encoded by a layered neighborhood preserving code having most significant bits (MSBs) indicating a neighborhood in a code space, and having least significant bits (LSBs) indicating a location in the neighborhood; and a modulator/transmitter circuit coupled to the channel encoder, the modulator/transmitter circuit configured to prepare the output codeword for transmission over a physical channel.

17. The transmitter of claim 16, wherein the channel encoder comprises:
   a first processor configured to generate a first address from the information vector, wherein the first processor utilizes a linear block code;
   a second processor configured to generate a second address from the information vector, wherein the second processor utilizes a linear block code; and
   a layered code encoder coupled to the first processor and to the second processor, the layered code encoder configured to generate the output codeword based on the first address and the second address.

18. The transmitter of claim 17, wherein the layered code encoder comprises:
   a first encoder configured to encode the first address into an intermediate sequence; and
   a second encoder coupled to the first encoder, the second encoder configured to generate the output codeword based on the intermediate sequence and the second address.

19. A communication module comprising:
   an address generator configured to generate a first address and a second address from an information string using a linear operation;
   a layered code encoder configured to encode both the first address and the second address to produce a codeword; and
   a transmitter configured to transmit the codeword.

20. The communication module of claim 19, wherein the address generator is configured to generate the first address from the information string based on a linear block code, and to generate the second address from the information string based on the linear block code.

21. The communication module of claim 20, wherein the address generator comprises a linear block decoder configured to generate the first address by decoding the information string.

22. The communication module of claim 21, wherein the first address satisfies $$U = M_1 G + E,$$

where U is the information string, $M_1$ is the first address, G is a generator matrix for the linear block code, and E is an error vector.

23. The communication module of claim 20, wherein the address generator is configured to generate the second address by computing a syndrome from the information string based on the linear block code.

24. The communication module of claim 23, wherein the address generator is configured to generate the second address by evaluating $$M_2 = UH^T,$$

where $M_2$ is the second address, U is the information string, and H is a parity check matrix of the linear block code.

25. The communication module of claim 19, wherein the encoder comprises:
   an information string generator configured to generate an intermediate information string based on the first address; and
   a codeword generator configured to generate the codeword based on the intermediate information string and the second address.

26. The communication module of claim 19, wherein the linear operation is based on a linear block code, and wherein the information string is of length k, the first address is of length $k_1$, and the second address is of length $(k-k_1)$, where k and $k_1$ are integer values, and wherein the linear block code comprises a $(k, k_1)$ linear block code.

* * * * *